(12) United States Patent
Ali

(10) Patent No.: US 7,414,564 B1
(45) Date of Patent: Aug. 19, 2008

(54) ENHANCED-ACCURACY CONVERTER STAGES FOR PIPELINED SIGNAL CONVERTER SYSTEMS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/820,298

(22) Filed: Jun. 18, 2007

(51) Int. Cl.
*H03M 1/38* (2006.01)
(52) U.S. Cl. ............... 341/161; 341/118; 341/155; 341/162; 341/172
(58) Field of Classification Search ............ 341/118, 341/161, 162, 172
See application file for complete search history.

(56) References Cited

U.S. PATENT DOCUMENTS

| | | | | |
|---|---|---|---|---|
| 5,635,937 | A | 6/1997 | Lim et al. | 341/161 |
| 6,337,651 | B1 | 1/2002 | Chiang | 341/161 |
| 6,359,579 | B1 | 3/2002 | Chiang | 341/155 |
| 6,366,230 | B1 * | 4/2002 | Zhang et al. | 341/162 |
| 6,486,807 | B2 | 11/2002 | Jonsson | 341/120 |
| 6,515,611 | B1 * | 2/2003 | Fetterman et al. | 341/161 |
| 6,570,411 | B1 | 5/2003 | Bardsley et al. | 327/94 |
| 6,600,440 | B1 * | 7/2003 | Sakurai | 341/172 |
| 6,778,010 | B1 | 8/2004 | Michalski | 330/9 |
| 6,784,824 | B1 * | 8/2004 | Quinn | 341/172 |
| 6,801,151 | B1 * | 10/2004 | Opris | 341/161 |
| 6,859,159 | B2 | 2/2005 | Michalski | 330/172 |
| 6,963,300 | B1 | 11/2005 | Lee | 341/172 |
| 7,042,383 | B2 * | 5/2006 | Mishra et al. | 341/156 |
| 7,126,507 | B2 * | 10/2006 | Lee | 341/118 |
| 7,265,705 | B1 * | 9/2007 | Lee et al. | 341/162 |
| 2006/0261900 | A1 | 11/2006 | Ali | |

OTHER PUBLICATIONS

Liu, Hung-Chih, et al., "A 15-b 40-MS/s CMOS Pipelined—Converter with—Calibration", IEEE Journal of Solid-State Circuits, vol. 40, No. 5, pp. 1047-1056, May 2005.
Ferris, Mark, et al., "A 10 bit 100MHz Pipeline ADC", University of Michigan, 598 Design Project, pp. 1-5, Mar. 2004.
"Pipeline ADCs Come of Age", Dallas Semiconductor MAXIM, Application Note 634, 12 pages, Mar. 2000.
Mehr, Iuri, et al., "A 55-mW, 10-bit, 40-Msample/s Nyquiest-Rate CMOSO ADC", IEEE Journal of Solid-State Circuits, vol. 35, No. 3, Mar. 2000, pp. 318-325.

\* cited by examiner

*Primary Examiner*—Khai M Nguyen
(74) *Attorney, Agent, or Firm*—Koppel, Patrick, Heybl & Dawson

(57) ABSTRACT

Converter systems are provided which complement sample capacitors in at least one converter stage with replica capacitors. The replica capacitors are switched to receive replica charges from the analog input signal during the same operational mode in which the sample capacitors receive undesirable remnant charges. In an initial portion of a subsequent operational mode, the remnant capacitors are briefly switched to the sample capacitors to substantially cancel the remnant charges. The sample capacitors then participate in obtaining input-signal samples during the remainder of the subsequent operational mode. Because the remnant charges have been substantially canceled, the accuracy of the subsequent operational mode is considerably enhanced. In another system embodiment, the replica capacitor is replaced by a discharge switch which provides a discharge path in an initial portion of the subsequent operational mode.

20 Claims, 6 Drawing Sheets

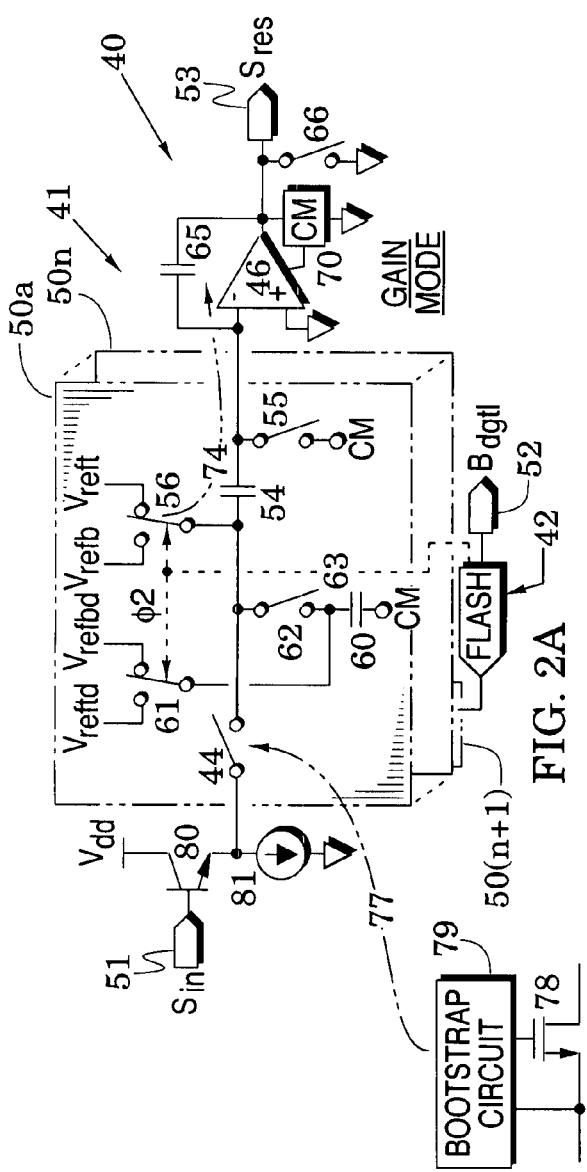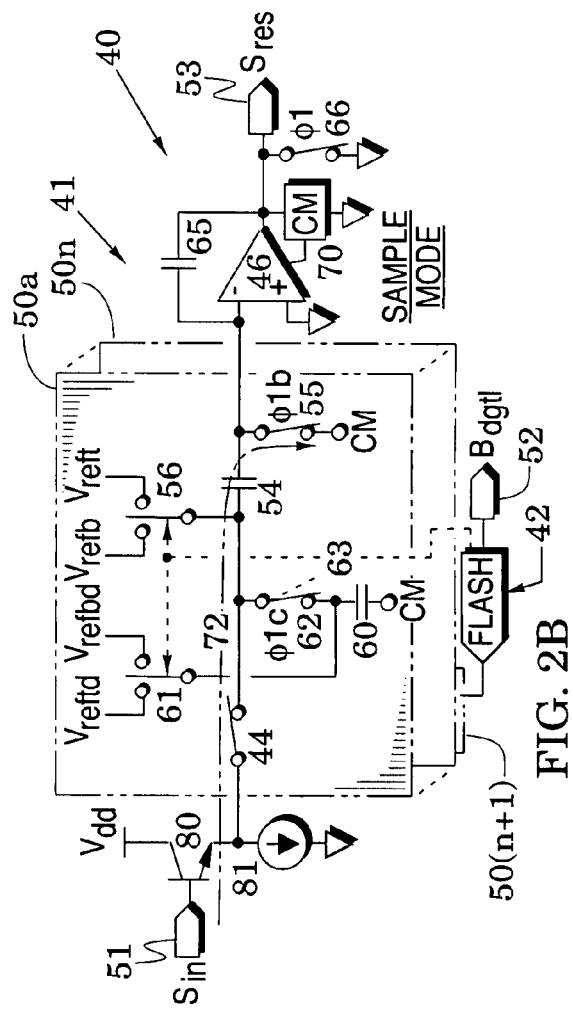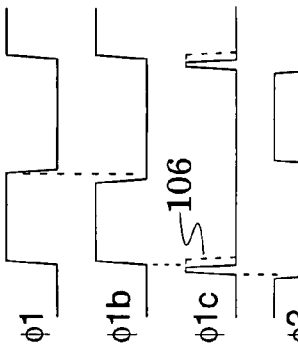

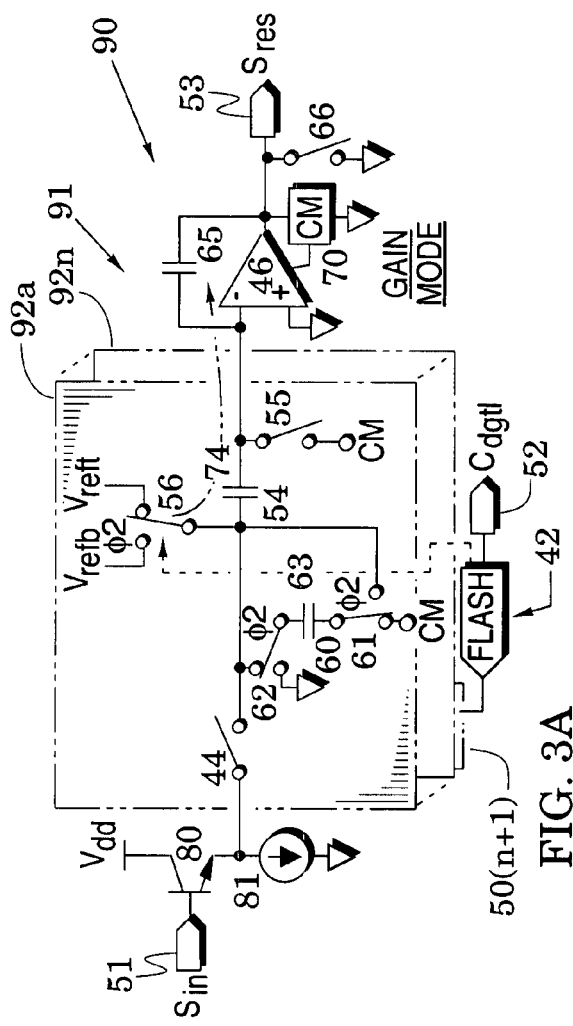
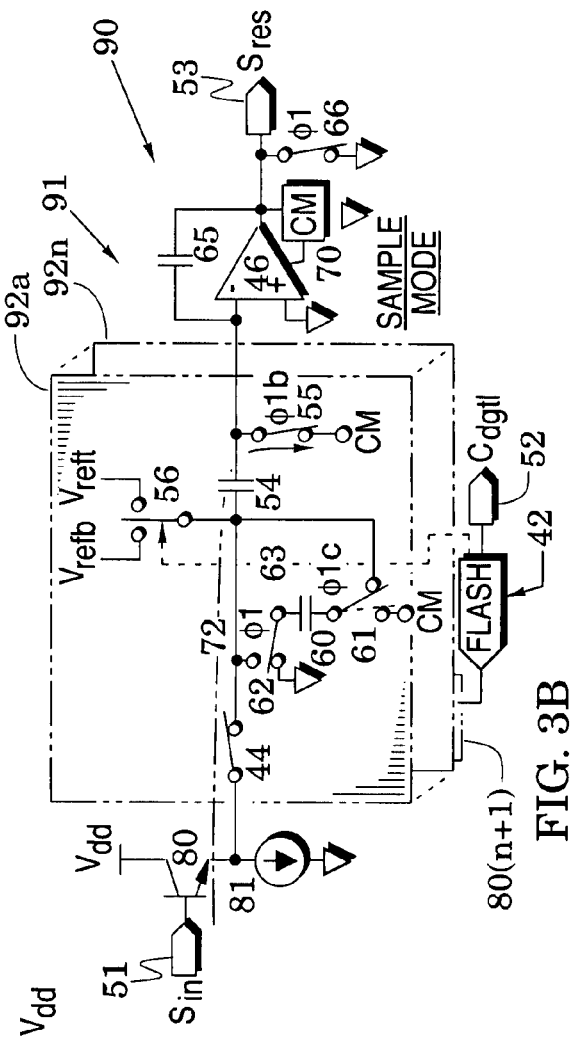
FIG. 3A
FIG. 3B

US 7,414,564 B1

ENHANCED-ACCURACY CONVERTER STAGES FOR PIPELINED SIGNAL CONVERTER SYSTEMS

BACKGROUND OF THE INVENTION

1. Field of the Invention

The present invention relates generally to pipelined analog-to-digital converter systems.

2. Description of the Related Art

Switched-capacitor pipelined signal converter systems arrange a plurality of converter stages so that they successively convert an analog input signal to corresponding digital bits. All but the last one of the stages provides a residue signal for processing by a succeeding one of the stages. The successive digital bits can then be temporally aligned so that they form a digital code which corresponds to the original input signal.

One class of these pipelined systems inserts a sampler ahead of the converter stages. The sampler forms samples of the input signal which are then presented to the initial stage for processing. Because the sampler consumes additional power and contributes to system noise and distortion, it is eliminated in a second class of pipelined converter systems. The sampler is often referred to as a sample-and-hold amplifier (SHA)) and, accordingly, the second class of systems is often said to have a "SHA-less" architecture.

Although SHA-less converter systems have the capability to reduce power consumption, noise and distortion, they introduce other problems because capacitors in the initial converter stage are now involved in a sampling process in addition to their conversion and residue generation processes. To resolve these problems, some SHA-less systems provide additional capacitors in the initial stage for the sampling process and/or insert additional buffering prior to the initial stage. These provisions, however, generally increase power consumption and noise and reduce speed capability. Other SHA-less systems provide a brief time for resetting of the stage capacitors but this additional time, of course, significantly reduces speed capability.

BRIEF SUMMARY OF THE INVENTION

The present invention is directed to converter stages that provide enhanced accuracy in pipelined converter systems. The novel features of the invention are set forth with particularity in the appended claims. The invention will be best understood from the following description when read in conjunction with the accompanying drawings.

BRIEF DESCRIPTION OF THE DRAWINGS

FIGS. 2A and 2B are schematics that illustrate gain and sample operational modes in an embodiment of a converter stage in the system of FIG. 1;

FIG. 2C is a timing diagram that shows different clock signals in the modes of FIGS. 2A and 2B;

FIGS. 3A and 3B are schematics that illustrate gain and sample operational modes in another embodiment of a converter stage in the system of FIG. 1;

DETAILED DESCRIPTION OF THE INVENTION

Converter system embodiments are shown in FIGS. 1A-5 which complement sample capacitors in at least one converter stage with replica capacitors. The replica capacitors are switched to receive replica charges from an analog input signal during the same operational mode in which the sample capacitors receive undesirable remnant charges.

In an initial portion of a subsequent operational mode, the remnant capacitors are briefly switched to the sample capacitors to substantially cancel the remnant charges. The sample capacitors then participate in obtaining input-signal samples during the remainder of the subsequent operational mode. Because the remnant charges have been substantially canceled, the accuracy of the subsequent operational mode is considerably enhanced.

Figure 1:
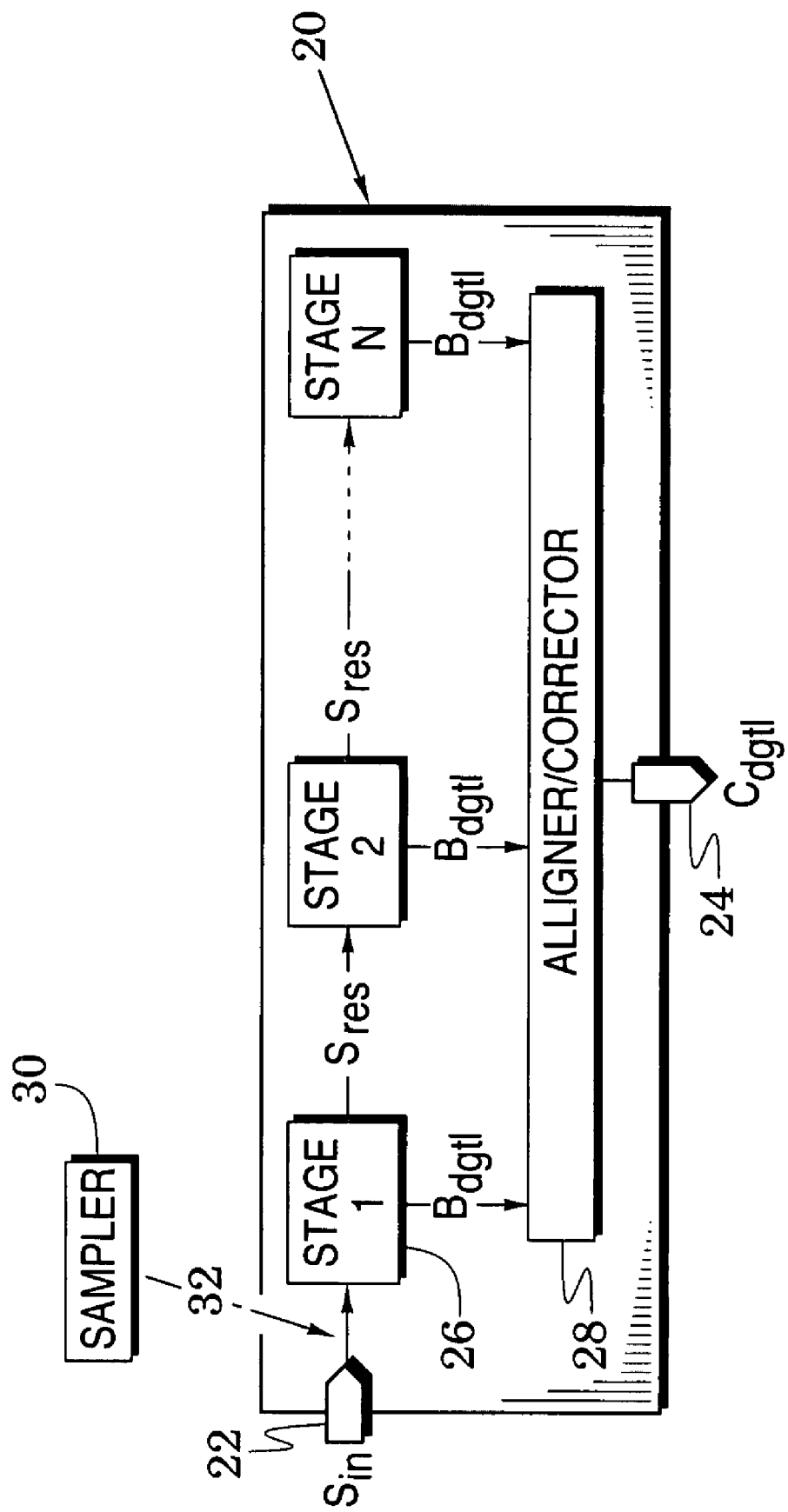
FIG. 1 is a block diagram of a pipelined analog-to-digital converter embodiment of the present invention.

FIG. 1 illustrates an analog-to-digital converter system embodiment 20 which converts an analog input signal $S_{in}$ at an input port 22 into a corresponding digital code $C_{dgtl}$ at an output port 24. The converter 20 includes N converter stages 26 that successively convert the input signal to corresponding digital bits $B_{dgt}$ wherein all but an Nth one of the stages provides a residue signal $S_{res}$ for processing by a succeeding one of the stages.

Because of the successive conversion, the corresponding digital bits $B_{dgt}$ must be temporally aligned to facilitate generation of the corresponding digital code $C_{dgtl}$. In addition, the converter stages are preferably configured to provide redundant bits which facilitate correction of conversion errors in the stages. Accordingly, the converter 20 also includes an aligner/corrector 28 that performs these aligning and correcting functions and provides digital codes $C_{dgtl}$ that each corresponds to a corresponding sample of the input signal $S_{in}$. Systems similar to the system 20 are often referred to as pipelined systems.

In many converter system embodiments, a sampler 30 is inserted (as indicated by insertion arrow 32) before the first converter stage to respond to a system clock signal. The sampler (often termed a sample-and-hold amplifier (SHA)) obtains and presents successive held samples of the input signal to the initial converter stage which successively processes the samples. It has been found, however, that samplers generally consume a significant amount of power because they must handle the full swing of the input signal and substantially contribute to the distortion and noise of the converter system because they are not preceded by any amplification.

The system 20 replaces the sampler with a sample-transmission device in the initial converter stage wherein this device may be, for example, a transistor switch that is alternately biased on and off. Although this sampler replacement significantly reduces the power consumption, distortion and noise of the sampler, it presents some operational challenges.

One of these challenges relates to operation of switched capacitors in the initial converter stage. With inclusion of the sampler 30, these capacitors were presented with held samples of the input signal. Now, the capacitors of the initial stage must sample the input signal and also process the samples. This dual responsibility decreases the time in each clock pulse that is available for each of the initial stage's processes.

Another of the challenges relates to operational modes of the converter stages 26. In a gain operational mode, some of the capacitors of each stage are coupled to selected ones of reference signals to thereby generate this stage's residue signal $S_{res}$. The selected reference signals are determined by the stage's digital code which is a quantized estimate of the stage's input signal.

Application of these reference signals thus leaves quantized remnant charges in the capacitors as the stage proceeds to its subsequent sample mode of operation in which the input signal is again presented to the capacitors. Because the remnant charges are quantized, they vary nonlinearly with the input signal and this nonlinearity degrades the accuracy of the signal conversion process. This degradation is especially apparent at high conversion rates when the time for settling of the voltage kick-back becomes significantly limited.

These challenges are substantially resolved with the converter stage 40 of FIGS. 2A and 2B. Although the teachings of the invention are particularly suited for use in an initial one of the stages of FIG. 1, they may advantageously be used in any of the stages. In addition to a flash converter 42, the stage 40 includes a residue generator 41 which couples a switched-capacitor structure 50a with a sample-transmission device to a downstream amplifier 46. In an embodiment, the sample-transmission device is an upstream sample switch 44 which passes the analog input signal $S_{in}$ from an input port 51 and, in response, the flash converter provides corresponding digital bits $B_{dgt}$ to a code port 52, and the residue generator provides a residue signal $S_{res}$ to a residue port 53.

A sample capacitor 54 is arranged between the sample switch 44 and the amplifier 46 with a second sample switch 55 arranged to couple the downstream plate of the capacitor to a common-mode level CM. A reference switch 56 is arranged to couple the upstream plate to a selected one of a top reference voltage $V_{reft}$ and a bottom reference voltage $V_{refb}$. In addition, a replica capacitor 60 has a lower plate coupled to the common-mode level CM and has an upper plate that can be coupled to a selected one of a dummy bottom reference voltage $V_{refbd}$ and a dummy top reference voltage $V_{reftd}$ by a first replica switch 61. The upper plate can also be coupled to the top plate of the sample capacitor 54 by a second replica switch 62.

As indicated by broken lines 63 in FIGS. 2A and 2B, the reference switch 56 and the first replica switch 61 are positioned in accordance with the digital bit decisions that the flash converter 42 makes in response to the input signal $S_{in}$.

In addition, an output capacitor 65 is coupled across the amplifier 46 and an associated output switch 66 can couple the output of the amplifier to ground. A common-mode control circuit 70 is arranged to compare the output level of the amplifier to a common-mode reference in the gain mode of FIG. 2A and, in the sample mode, apply any difference as a feedback signal to the amplifier to properly maintain the desired common-mode level at the amplifier output (also shown as the common-mode level CM at the switch 55 and replica capacitor 60). As an example, the feedback signal can be applied to adjust the current of a current source that sets an amplifier current in the amplifier 46.

FIGS. 2A and 2B respectively illustrate gain and sample operational modes of the converter stage embodiment 40. To facilitate a description of the operation of the stage's switches in these modes, FIG. 2C shows clock signals which include a φ1 clock, a φ1b clock, a φ1c clock, and a φ2 clock. Each of these clocks is shown in association with at least one respective switch in FIGS. 2A, 2B, 3A, 3B and 4 to indicate that the respective switch is closed during the high portion of the clock.

The φ1b clock is substantially a copy of the φ1 clock except that it terminates slightly ahead of the termination of the φ1 clock. In FIG. 2C, a vertical broken line is inserted between the φ1 clock and the φ1b clock to emphasize this difference in termination times. The φ2 clock is similar to the φ1 clock but is substantially 180 degrees out of phase with the φ1 clock. The φ1c clock is much narrower than the φ1 and φ2 clocks and it is preferably inserted, as indicated by two additional vertical broken lines, between the termination of the φ2 clock and the initiation of the φ1 clock.

In the sample mode of FIG. 2B, the sample switch 44 and the second sample switch 55 are closed in respective response to the φ1 and φ1b clocks to thereby allow electrical charges from the input signal $S_{in}$ to flow along a signal path 72 to the sample capacitor 54. In accordance with the φ1b clock, the second sample switch 55 opens slightly before the end of the sample mode (i.e., slightly ahead of the opening of the sample switch 44) to thereby enhance the accuracy of the sample that is captured in the sample capacitor 54. It is noted that the output switch 66 is also closed during the sample mode to discharge the output capacitor 65.

In the gain mode of FIG. 2A, the flash converter 42 responds to the captured sample of the input signal $S_{in}$ by providing the corresponding digital bits $B_{dgt}$ at the code port 52 and setting the positions of the reference and replica switches 56 and 61 in accordance with those digital bits. In the example shown in FIG. 2A, a top reference voltage $V_{reft}$ is presented by the reference switch 56 to the upstream plate of the sample capacitor 55 and a dummy bottom reference voltage $V_{refbd}$ is presented by the replica switch 61 to the upper plate of the replica capacitor. For other values of the input signal, the flash converter 42 may instead set the reference and replica switches to respectively present a bottom reference voltage $V_{refb}$ and a dummy top reference voltage $V_{reftd}$.

Electrical charges are thus transferred along a signal path 72 through the reference capacitor 54 and into the output capacitor 65. This transfer is facilitated by opening the output switch 66 during the gain mode. In accordance with an important feature of the invention, similar electrical charges are directed via the replica switch 61 to place a replica charge into the replica capacitor 60 during the gain mode.

At the end of the φ1 clock, operation of the initial converter stage 40 again returns to the sample mode shown in FIG. 2B. Because the top reference voltage $V_{reft}$ was previously coupled to the reference switch 54, a remnant charge now remains installed in this capacitor. As described above, this remnant charge may substantially degrade the accuracy of the generated residue signal $S_{res}$.

However, when the second replica switch 62 is closed during the φ1c clock, the replica charge in the replica capacitor 63 is coupled to the remnant charge in the sample capacitor 62. If the reference voltages $V_{reft}$ and $V_{refub}$ are equally and oppositely spaced from the common-mode level CM and if the sample and replica capacitors 54 and 60 are equally sized, the remnant and replica charges will be equally sized but oppositely polarized (with respect to the level CM).

Accordingly, the electrical charge in the sample capacitor 54 will be substantially canceled during the φ1c clock. When the first and second sample switches 44 and 55 close in FIG. 2B in respective response to the φ1 and φ1b clocks, they now apply the input signal to a sample capacitor 54 that has no remaining remnant charge. Accordingly, the accuracy of the injected charge is substantially enhanced.

In other timing embodiments, the φ1c clock in FIG. 2C may be extended somewhat into the φ1 clock or may be moved so that it occupies an initial portion of the φ1 clock. In all of these timing embodiments, the remnant charge will be substantially removed from the sample capacitor 54 to thereby enhance the accuracy of the sample that is subsequently captured in the sample capacitor 54

As shown by a substitution arrow 77 in FIG. 2A, the sample switch 44 may be realized with a transistor 78. Because the supply voltage may quite limited in some stage embodiments, any of various conventional bootstrap circuits 79 may be used to enhance the voltage at the control terminal of the transistor and thereby reduce its switch resistance during the sample mode.

As shown in FIGS. 2A and 2B, an upstream emitter follower 80 may be inserted between the sample switch 44 and the input port 51 and coupled to an associated current source 81. The follower 80 isolates the input port from the downstream switching operations and from charge injections that may result from those operations.

In addition to the sample switch of each of the switched-capacitor structures 50a-50n, another sample switch 44 is preferably inserted before the flash converter 42 to provide isolation between it and the switched-capacitor structures. This is indicated by the structure 50(n+1) which contains a sample switch.

The switched-capacitor structure 50a is particularly suited for operation in a 1.5 bit converter stage. Other stage embodiments can be formed by adding additional structures as indicated by the switched-capacitor structure 50n and the broken lines connecting the structures 50a and 50n. For example, a 3 bit converter stage can be realized with eight of the switched-capacitor structures that are all coupled between the upstream switch 44 and the amplifier 46.

It is noted that the switched-capacitor structure of FIGS. 2A and 2B can be modified to form other embodiments. In one embodiment, for example, the output capacitor 65 can be arranged to also receive a signal path similar to the path 72 in the sample mode of FIG. 2B and then be switched about the amplifier 46 in the gain mode of FIG. 2A. It is further noted that the teachings of the invention can be applied to all of these embodiments to thus substantially cancel remnant charges in sample capacitors.

In an exemplary realization of the converter stage 40, the common-mode level CM could be 1.0V and the top reference voltage $V_{reft}$ and bottom reference voltage $V_{refb}$ could respectively be 1.5V and 0.5V. In this realization, the dummy bottom reference voltage $V_{refbd}$ and dummy top reference voltage $V_{reftd}$ would be provided by separate voltage sources that respectively provide 0.5V and 1.5V. Although they require additional structure, dummy sources decrease the current loading on the main sources that provide the top reference voltage $V_{reft}$ and bottom reference voltage $V_{refb}$. Accordingly, the accuracy of the main sources is enhanced.

When this additional accuracy is not needed, a simpler converter stage embodiment can be formed by substituting the main references for the dummy references in FIGS. 2A and 2B. In this stage embodiment, the dummy bottom reference voltage $V_{refbd}$ and dummy top reference voltage $V_{reftd}$ at the replica switch 61 would be respectively replaced by the top reference voltage $V_{reft}$ and bottom reference voltage $V_{refb}$.

Another converter stage embodiment 90 is shown in FIGS. 3A and 3B which respectively illustrate gain and sample operational modes. The embodiment 90 contains some elements of the converter stage 40 of FIGS. 2A and 2B with like elements indicated by like reference numbers. In contrast to the embodiment 40, however, the embodiment 90 has a residue generator 91 with switched-capacitor structures 92a-92n.

Each of these structures removes the top and bottom dummy references $V_{reftd}$ and $V_{refbd}$ shown in the structure 50a of FIGS. 2A and 2B and rearranges the second replica switch 62 to switch the upper plate of the replica capacitor 60 to the reference switch 56 in the gain mode and to ground in the sample mode. In addition, these structures move and rearrange the first replica switch 61 so that it switches the lower plate of the replica capacitor 60 to the common-mode level CM in the gain mode and to the sample capacitor 54 in the sample mode.

In operation of the converter stage 90, the sample capacitor 54 is left with a remnant charge at the end of the gain mode of FIG. 3A as described above relative to FIG. 2A. During this gain mode, the top reference voltage $V_{reft}$ is presented to the lower plate of the replica capacitor to thereby insert a replica charge into this capacitor. In the succeeding φ1c clock of FIG. 3C, the first and second replica switches 61 and 62 are thrown to couple the lower plate to the sample capacitor. Because both capacitors were charged in the gain mode by the top reference voltage $V_{reft}$ and the replica capacitor 60 is now inverted and coupled to the reference capacitor during the φ1c clock, its charge substantially cancels the charge in the sample capacitor 54.

The second replica switch 62 opens after the φ1c clock as indicated in FIG. 3B by the broken-line switch position. In the remainder of the φ1 clock, the converter stage 90 operates in the sample mode as described above for the converter stage 40. Because the remnant charge in the sample capacitor has been substantially canceled during the φ1c clock, the sample mode is now able to capture a sample of the input signal in the sample capacitor 74 with enhanced accuracy.

To compare the stage embodiments 40 and 90, it is noted that in the converter stage embodiment 40 of FIGS. 2A and 2B, a reference voltage was coupled, in the gain stage, to the sample capacitor while a first plate of the replica capacitor was coupled to a different reference voltage (or a dummy version thereof). This first plate was then coupled to the sample capacitor 54 during the φ1c clock. In the converter stage embodiment 90 of FIGS. 3A and 2B, a reference voltage was coupled, in the gain stage, to the sample capacitor and a first plate of the replica capacitor. A second plate of the replica capacitor was then coupled to the sample capacitor 54 during the φ1c clock.

Figure 4A:
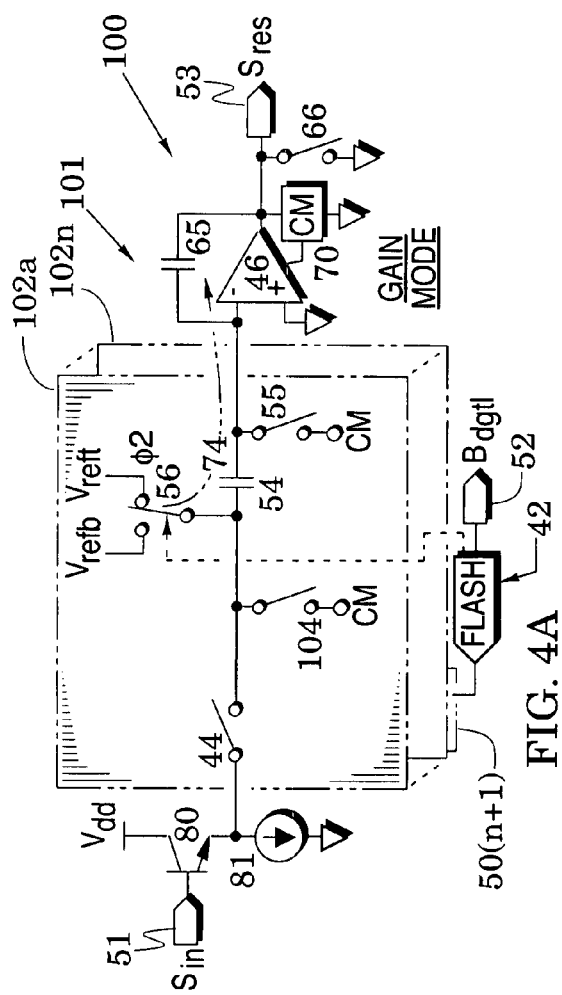
FIGS. 4A and 4B are schematics that illustrate gain and sample operational modes in yet another embodiment of a converter stage in the system of FIG. 1.
Figure 4B:
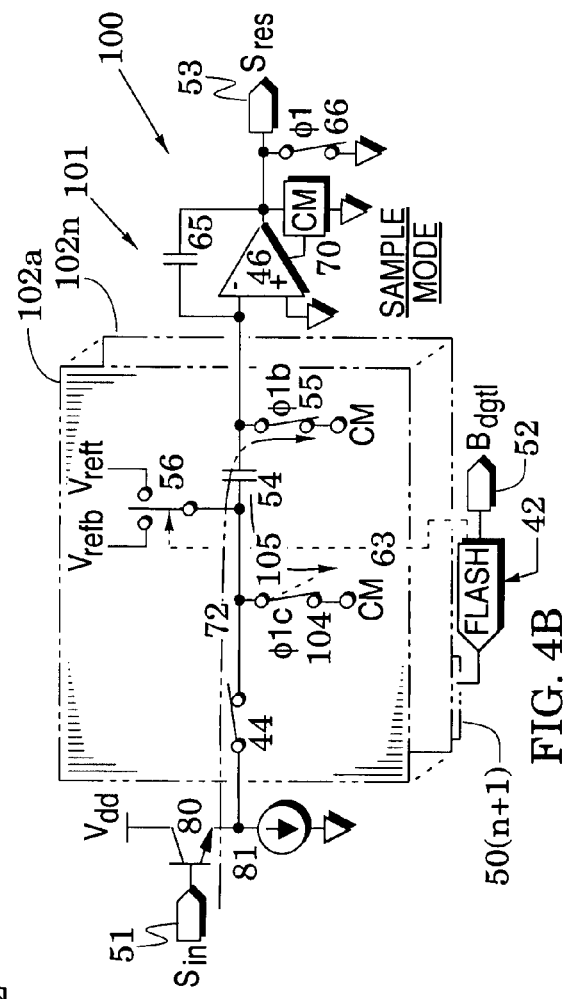

Yet another converter stage embodiment 100 is shown in FIGS. 4A and 4B which respectively illustrate gain and sample operational modes. The embodiment 100 contains some elements of the converter stage 40 of FIGS. 2A and 2B with like elements indicated by like reference numbers. In contrast to the embodiment 40, however, the embodiment 100 has a residue generator 101 with switched-capacitor structures 102a-102n. Each of the structures 102a-102n replaces the replica capacitor 60 and the replica switches 61 and 62 with a discharge switch 104 that is coupled to the top plate of the sample capacitor 54.

As shown in FIG. 4B, the discharge switch 104 closes in response to the φ1c clock that is shown in FIG. 2C. This switch provides a discharge path 105 through which substantially all of the remnant charge of the sample capacitor 55 will be discharged. When the first and second sample switches 44 and 55 close in FIG. 4B in respective response to the φ1 and φ1b clocks, they now apply the input signal to a sample capacitor 54 that has no remaining remnant charge. Accordingly, the accuracy of the injected charge is substantially enhanced. The broken-line position of the discharge switch 194 in FIG. 4B indicates that this switch is open during the remainder of the sample mode when the first and second sample switches 44 and 55 are closed.

As mentioned above with reference to FIGS. 2A and 2B, the remnant charge in the sample capacitor 54 will be substantially canceled during the φ1c clock if the reference voltages $V_{reft}$ and $V_{refub}$ are equally and oppositely spaced from the common-mode level CM and if the sample and replica capacitors 54 and 60 are equally sized. In contrast, the accuracy of the removal of the remnant charge in the embodiment 100 of FIGS. 4A and 4B does not depend on any parameters because the remnant charge will simply discharge through the discharge path of the closed discharge switch 104.

When using the converter stage embodiment 100 and its discharge switch 104, however, care must be taken that the φ1c clock in FIG. 2C does not extend into the φ1 clock as shown by the broken lines 106 in FIG. 2C. Were this to happen, the signal path 72 to the sample capacitor 54 during the sample mode would be shunted by the discharge path 105 through the discharge switch 104 which would significantly degrade the accuracy of the sample of the input signal $S_{in}$ that is stored in the sample capacitor.

If the φ1c clock extends into the φ1 clock (as shown by the broken lines 106 in FIG. 2C) when the stage embodiments 40 and 90 of FIGS. 2A-3B are used, the disturbance of the signal path 72 is substantially less than that caused by the discharge switch. With the embodiment 40 of FIGS. 2A and 2B, for example, a slight extension of the φ1c clock may even be advantageous as it extends the time for the replica charge in the replica capacitor 60 to completely cancel the remnant charge. The extension 106 of the φ1c clock can be adjusted in this embodiment to balance the advantages of this additional cancellation time against the disadvantages of the disturbance of the signal path 72.

Figure 5:
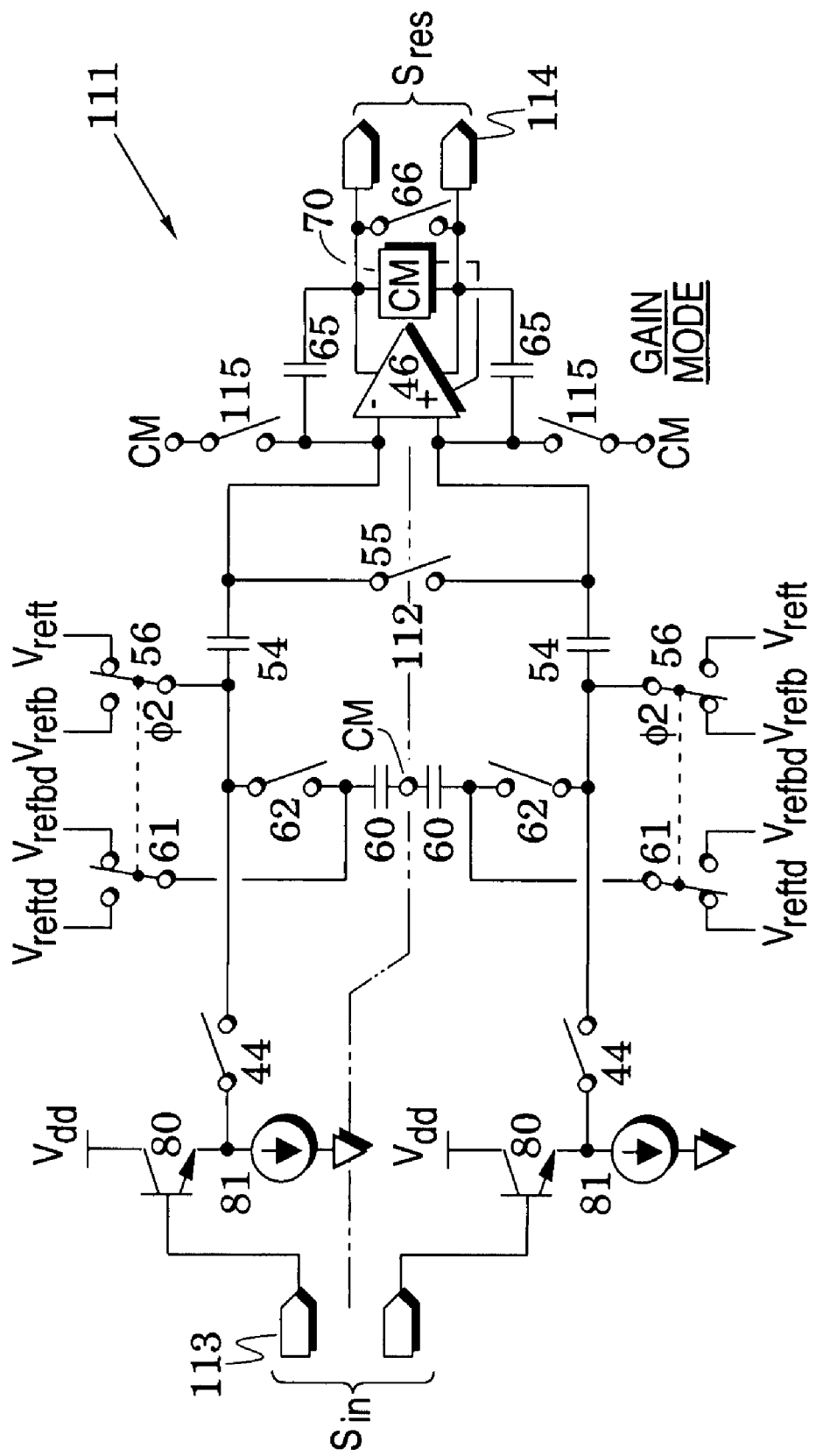
FIG. 5 is a schematic of a differential embodiment of the residue generator shown in FIG. 2A.

A differential residue generator embodiment 111 is shown in FIG. 5. This is a differential embodiment of the generator embodiment 41 of FIGS. 2A and 2B. It is shown in the same gain mode and, above and below a stage centerline 112, indicates like elements with like reference numbers. In the differential embodiment 111, however, the analog input signal $S_{in}$ is received from a differential input port 113 and the residue signal $S_{res}$ is provided at a differential residue port 114.

The second sample switch 55 is coupled across the differential input of the amplifier 46 and the sample capacitors 60 are joined to receive the common-mode level CM. In addition, input switches 115 are provided to couple the input of the amplifier 46 to the common-mode level CM in the operational sample mode. The amplifier has a differential output and output capacitors 65 are coupled between input and output ports of the amplifier. The output switch 66 and the common-mode control circuit 70 are coupled across the differential output.

It is noted that when the reference and replica switches 56 and 61 in the upper portion of the generator are respectively switched to the top reference voltage $V_{reft}$ and the dummy bottom reference voltage $V_{refbd}$, the reference and replica switches in the lower portion are oppositely switched (i.e., to the bottom reference voltage $V_{refb}$ and the dummy top reference voltage $V_{reftd}$).

Figure 6:
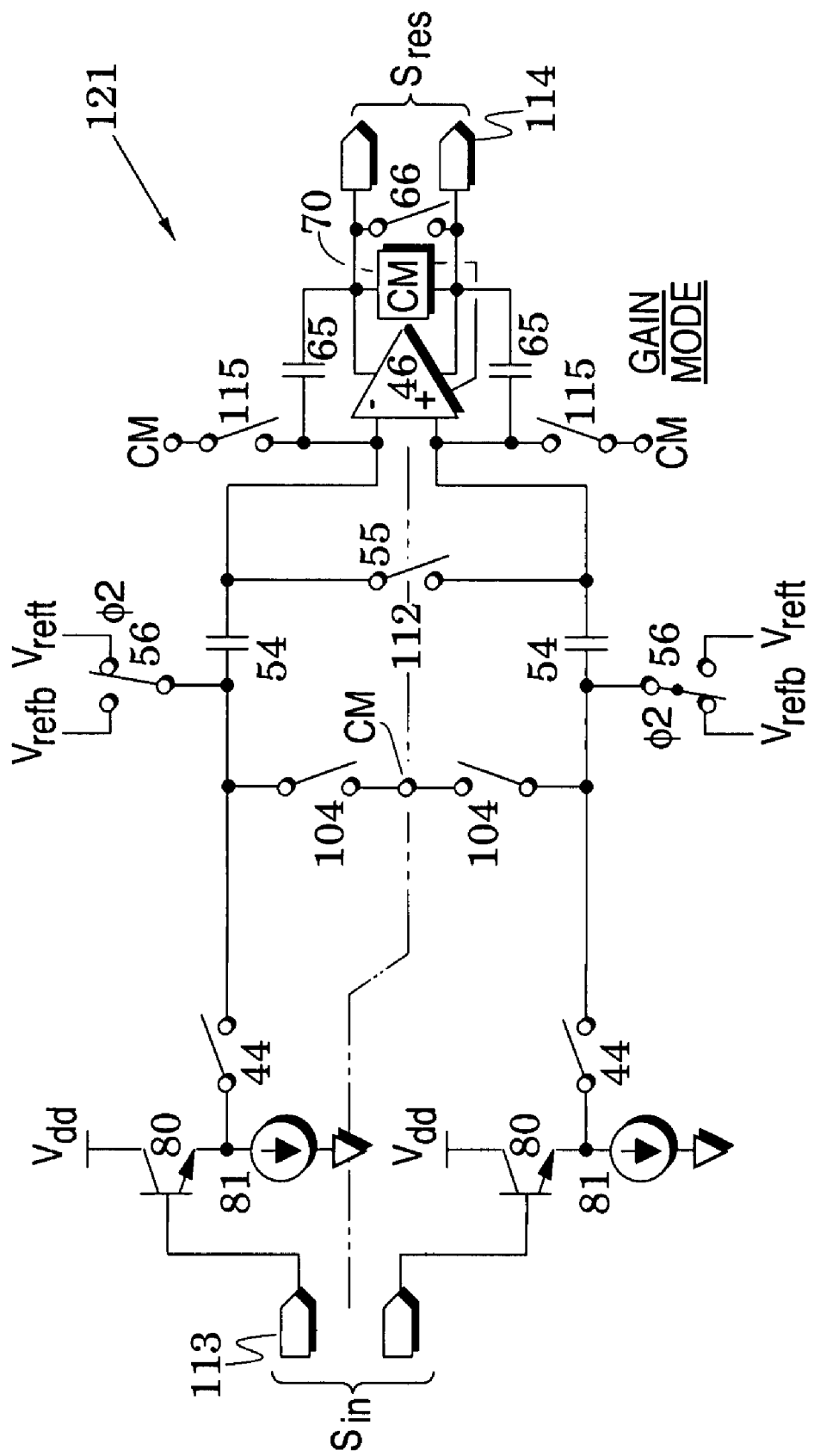
FIG. 6 is a schematic of a differential embodiment of the residue generator shown in FIG. 4A.

Another differential residue generator embodiment 121 is shown in FIG. 6. This is a differential embodiment of the generator embodiment 111 of FIGS. 4A and 4B. It is shown in the same gain mode as FIG. 4A and, above and below a stage centerline 112, indicates like elements with like reference numbers. This embodiment also includes like elements introduced in FIG. 5 with like elements indicated with like reference numbers. As in the differential embodiment 111 of FIG. 5, the analog input signal $S_{in}$ is received from a differential input port 113 and the residue signal $S_{res}$ is provided at a differential residue port 114.

In another differential residue generator embodiment, the pair of discharge switches 104 and the associated common-mode terminal may be replaced by a single discharge switch.

Although embodiments of the invention have been described with combinations of specific transistor types (e.g., metal-oxide-semiconductor and bipolar junction transistors), other embodiments may include different combinations of these types.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A converter stage configured to process an analog input signal to a corresponding digital code and a residue signal in sample and gain operational modes, comprising:
   a switched-capacitor residue generator having at least one sample capacitor and an amplifier and arranged to switchably direct, in said sample mode, a sample of said input signal to said sample capacitor and to switchably couple, in said gain mode, said sample capacitor between a selected one of a plurality of reference signals and said amplifier to thereby provide said residue signal with a remnant charge thereby remaining in said sample capacitor;
   a flash converter arranged to receive said sample during said sample mode and to provide said corresponding digital code and identify said selected reference signal during said gain mode; and
   at least one replica capacitor arranged to switchably receive a replica charge in said gain mode and to be switchably coupled to said sample capacitor in a portion of said sample mode to thereby substantially cancel said remnant charge with said replica charge.

2. The stage of claim 1, wherein said generator includes a reference switch which couples said sample capacitor to said selected reference signal in said gain mode and further including at least one replica switch that couples a first plate of said replica capacitor to a different one of said reference signals in said gain mode and couples said first plate to said sample capacitor in said portion.

3. The stage of claim 1, wherein said different reference signal is a dummy reference signal.

4. The stage of claim 1, wherein said generator includes a reference switch which couples said sample capacitor to said selected reference signal in said gain mode and further including at least one replica switch that couples a first plate of said replica capacitor to said selected reference signal in said gain mode and couples a second plate of said replica capacitor to said sample capacitor in said portion.

5. The stage of claim 1, wherein said generator includes a reference switch which couples said sample capacitor to said selected reference signal in said gain mode and further including at least one replica switch that couples a first plate of said replica capacitor to a dummy version of said selected reference signal in said gain mode and couples a second plate of said replica capacitor to said sample capacitor in said portion.

6. The stage of claim 1, wherein said generator includes an output capacitor coupled about said amplifier.

7. The stage of claim 1, wherein said generator includes an upstream sample switch arranged to provide said sample in said sample mode.

8. The stage of claim 7, wherein said sample switch is a transistor.

9. The stage of claim 7, wherein said generator further includes an upstream emitter follower inserted to pass said input signal to said sample switch.

10. The stage of claim 1, wherein said sample and replica capacitors are equally sized.

11. The stage of claim 1, wherein said generator includes:
a first sample switch that provides a signal path to a first plate of said sample capacitor in said sample mode; and
a second sample switch that extends said signal path from a second plate of said sample capacitor in at least a portion of said sample mode.

12. A converter stage configured to process an analog input signal to a corresponding digital code and a residue signal in sample and gain operational modes, comprising:
a switched-capacitor residue generator having at least one sample capacitor and an amplifier and arranged to switchably direct, in said sample mode, a sample of said input signal to said sample capacitor and to switchably couple, in said gain mode, said sample capacitor between a selected one of a plurality of reference signals and said amplifier to thereby provide said residue signal with a remnant charge thereby remaining in said sample capacitor;
a flash converter arranged to receive said sample during said sample mode and to provide said corresponding digital code and identify said selected reference signal during said gain mode; and
a discharge switch coupled to said sample capacitor to provide a discharge path that substantially discharges said remnant charge in a portion of said sample mode.

13. The stage of claim 12, wherein said generator includes a sample switch arranged to provide said sample in said sample mode.

14. The stage of claim 13, wherein said sample switch is a transistor.

15. The stage of claim 13, wherein said generator further includes an upstream emitter follower inserted to pass said input signal to said sample switch.

16. The stage of claim 12, wherein said generator includes:
a first sample switch that provides a signal path to a first plate of said sample capacitor in said sample mode; and
a second sample switch that extends said signal path from a second plate of said sample capacitor in at least a portion of said sample mode.

17. A signal converter system for converting an analog input signal into a corresponding digital code, the system comprising:
N converter stages that successively convert said input signal to corresponding digital bits wherein all but an Nth one of said stages provides a residue signal for processing by a succeeding one of said stages; and
an aligner/corrector that provides said corresponding digital code in response to said digital bits;
wherein at least one of said stages processes said input signal to corresponding digital bits and a residue signal in sample and gain operational modes and includes:
a switched-capacitor residue generator having at least one sample capacitor and an amplifier and arranged to switchably direct, in said sample mode, a sample of said input signal to said sample capacitor and to switchably couple, in said gain mode, said sample capacitor between a selected one of a plurality of reference signals and said amplifier to provide said residue signal and thereby insert a remnant charge in said sample capacitor;
a flash converter arranged to receive said sample during said sample mode and to provide said corresponding digital code and identify said selected reference signal during said gain mode; and
at least one replica capacitor arranged to switchably receive a replica charge in said gain mode and to be switchably coupled to said replica capacitor in a first portion of said sample mode to thereby substantially eliminate said remnant charge with said replica charge.

18. The system of claim 17, wherein said generator includes a reference switch which couples said sample capacitor to said selected reference signal in said gain mode and further including at least one replica switch that couples a first plate of said replica capacitor to a different one of said reference signals in said gain mode and couples said first plate to said sample capacitor in said portion.

19. The system of claim 17, wherein said generator includes a reference switch which couples said sample capacitor to said selected reference signal in said gain mode and further including at least one replica switch that couples a first plate of said replica capacitor to said selected reference signal in said gain mode and couples a second plate of said replica capacitor to said sample capacitor in said portion.

20. The system of claim 17, wherein said generator includes a reference switch which couples said sample capacitor to said selected reference signal in said gain mode and further including at least one replica switch that couples a first plate of said replica capacitor to a dummy version of said selected reference signal in said gain mode and couples a second plate of said replica capacitor to said sample capacitor in said portion.

* * * * *